(12) United States Patent
Alpert et al.

(10) Patent No.: US 8,584,070 B2
(45) Date of Patent: Nov. 12, 2013

(54) EVALUATING ROUTING CONGESTION BASED ON AVERAGE GLOBAL EDGE CONGESTION HISTOGRAMS

(75) Inventors: Charles J. Alpert, Austin, TX (US); Zhuo Li, Cedar Park, TX (US); Lakshmi N. Reddy, Briarcliff Manor, NY (US); Chin Ngai Sze, Austin, TX (US); Yaoguang Wei, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 13/252,868

(22) Filed: Oct. 4, 2011

(65) Prior Publication Data

US 2013/0086545 A1    Apr. 4, 2013

(51) Int. Cl.
*G06F 17/50* (2006.01)

(52) U.S. Cl.
USPC ............................ 716/129; 716/126; 716/131

(58) Field of Classification Search
USPC .......................................... 716/126, 129, 131
See application file for complete search history.

(56) References Cited

U.S. PATENT DOCUMENTS

| | | | |
|---|---|---|---|
| 5,587,923 A | 12/1996 | Wang | |
| 6,324,674 B2 | 11/2001 | Andreev et al. | |
| 6,557,145 B2 | 4/2003 | Boyle | |
| 6,601,222 B1 * | 7/2003 | Mehrotra et al. | 716/115 |
| 7,137,097 B1 * | 11/2006 | Aji et al. | 716/129 |
| 7,299,442 B2 * | 11/2007 | Alpert et al. | 716/129 |
| 7,594,214 B1 | 9/2009 | Salowe et al. | |
| 7,681,165 B2 | 3/2010 | Peter et al. | |
| 7,707,536 B2 * | 4/2010 | Lin et al. | 716/126 |
| 8,001,514 B2 * | 8/2011 | Chang et al. | 716/129 |
| 8,065,652 B1 * | 11/2011 | Salowe et al. | 716/139 |
| 8,185,858 B2 * | 5/2012 | Okamoto | 716/122 |
| 8,201,130 B1 * | 6/2012 | Kalman et al. | 716/126 |
| 2004/0243953 A1 * | 12/2004 | Ramachandran et al. | 716/5 |
| 2006/0156266 A1 * | 7/2006 | Alpert et al. | 716/13 |
| 2009/0144688 A1 | 6/2009 | Uchino et al. | |
| 2010/0031219 A1 * | 2/2010 | Okamoto | 716/10 |

OTHER PUBLICATIONS

IBM, "Congestion Driven Placement System Using Min-Cut Partitioning", Feb. 1, 2002. IBM Technical Disclosure Bulletin TDB-ACC-No: NNRD454151, Issue 454, p. 318.*

Saeedi, Medhi et al., "An Efficient Congestion Reduction Algorithm Based on Contour Plotting," 17th Int'l Conf.on Microelectronics (2005).

Saeedi, Medhi et al., "Prediction and Reduction of Routing Congestion," Proc. Int'l. Symposium on Physical Design (2006).

* cited by examiner

*Primary Examiner* — Stacy Whitmore
(74) *Attorney, Agent, or Firm* — Matthew W. Baca; Jack V. Musgrove

(57) ABSTRACT

Global routing congestion in an integrated circuit design is characterized by computing global edge congestions and constructing a histogram of averages of the global edge congestions for varying percentages of worst edge congestion, e.g., 0.5%, 1%, 2%, 5%, 10% and 20%. Horizontal and vertical global edges are handled separately. Global edges near blockages can be skipped to avoid false congestion hotspots. The histogram of the current global routing can be compared to a histogram for a previous global routing to select a best routing solution. The histograms can also be used in conjunction with congestion-driven physical synthesis tools.

24 Claims, 5 Drawing Sheets

Net Congestion 90%

| 50 | | | |
|---|---|---|---|
| 0.5 | 0.6 | 0.9 | 1.1 |
| 0.3 | 0.6 | 0.1 | 0.9 |
| 0.5 | 0.4 | 0.7 | 0.8 |
| 0.6 | 0.3 | 0.7 | 0.7 |
| 0.6 | 0.4 | 0.6 | 0.8 |

EVALUATING ROUTING CONGESTION BASED ON AVERAGE GLOBAL EDGE CONGESTION HISTOGRAMS

BACKGROUND OF THE INVENTION

1. Field of the Invention

The present invention generally relates to the design and manufacture of integrated circuits, and more particularly to a method of evaluating wire congestion after global routing of an integrated circuit design.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements combined to perform a logic function. Cell types include, for example, core cells, scan cells, input/output (I/O) cells, and memory (storage) cells. Each of the cells of an IC may have one or more pins (connection points for the cell), each of which in turn may be connected to one or more other pins of the IC by wires. The wires connecting the pins of the IC are also formed on the surface of the chip. For more complex designs, there are typically at least four distinct layers of conducting media available for vertical and/or horizontal routing: the polysilicon layer, and the metal-1, metal-2, and metal-3 layers.

An IC chip is fabricated by first conceiving the logical circuit description, and then converting that logical description into a physical description, or geometric layout. This process is usually carried out using a "netlist," which is a record of all of the nets, or interconnections, between the cell pins, including information about the various components such as transistors, resistors and capacitors. A layout typically consists of a set of planar geometric shapes in several layers. The layout is then checked to ensure that it meets all of the design requirements, particularly timing requirements. The process of converting the specifications of an electrical circuit into such a layout is called the physical design.

Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA), including Verilog, VHDL and TDML. A typical EDA system receives one or more high level behavioral descriptions of an IC device, and translates this high level design language description into netlists of various levels of abstraction.

Physical synthesis is prominent in the automated design of integrated circuits such as high performance processors and application specific integrated circuits (ASICs). Physical synthesis is the process of concurrently optimizing placement, timing, power consumption, crosstalk effects and the like in an integrated circuit design. This comprehensive approach helps to eliminate iterations between circuit analysis and place-and-route. Physical synthesis has the ability to repower gates (changing their sizes), insert repeaters (buffers or inverters), clone gates or other combinational logic, etc., so the area of logic in the design remains fluid. However, physical synthesis can take days to complete.

Routability is a key factor when performing circuit floorplanning or trying to close on timing via physical synthesis. A designer can expend considerable effort trying to get the design into a good state in terms of timing and signal integrity, only to subsequently find that it is unroutable. Ideally, the designer should be able to invoke a snapshot routability analysis that allows him or her to understand the routability issues involved from making floorplanning or optimization decisions.

Routing is typically performed in two stages known as global routing and detailed routing. In global routing, the circuit design area is partitioned into a grid of rectangles referred to variously as bins, buckets, global cells (g-cells), or tiles (referred to hereafter as tiles). Each of the boundaries between adjacent tiles is a global edge, and each global edge has wiring tracks used in assigning global interconnections, that is, connections between tiles without consideration of connections or pins inside a tile. Wiring congestion at a given edge is defined as the routing demand divided by the available track capacity. FIG. 1A illustrates an example of two adjacent tiles A and B having a common vertical edge (a vertical edge measures horizontal congestion, and a horizontal edge measures vertical congestion). In this example, there are five possible wiring tracks, and two of those tracks have been assigned connection wires, while a third is designated as a blockage. The resulting edge congestion is accordingly 3/5=60%.

Designers wanting to quantify overall congestion of a globally routed integrated circuit design have devised a set of routing metrics which are based on the congestion of all nets in the design. Net congestion is in turn based on the maximum congestion of global edges which are intersected by a net. FIG. 1B shows a simplified example of a globally routed design 2 having a net 4 with a source 6 and a sink 8. The net is L-shaped, and passes across three vertical edges and two horizontal edges whose edge congestion values are 0.5, 0.6, 0.9, 0.2, and 0.3, respectively. The congestion of net 4 is accordingly 90%. One common metric according to this scheme is the number of overflow nets, defined as the number of nets having a congestion greater than 100%. Similar metrics may use a different percentage, e.g., number of nets greater than 90% congested, or number of nets greater than 80% congested. Another common metric takes an average (mean) of the top 20% worst nets, i.e., the 20% of nets having the worst net congestion. In one example, a first design (Design A) might have an average worst 20% nets value of 89.1%, and an overflow (>100%) value of 9,532, while a second design (Design B) might have an average worst 20% nets value of 83.5%, and an overflow (>100%) value of 532. In such a case, Design B would be deemed preferable because of the lower average 20% and overflow values.

Designers can also use edge congestion values to generate graphic images for a snapshot congestion analysis. A congestion map can be generated by assigning different colors to different congestion values, e.g., blue for 0 to 70%, green for 70% to 80%, yellow for 80% to 90%, red for 90% to 100%, and white over 100%. Such congestion maps can be used for visual inspection to manually identify hotspots in the design.

SUMMARY OF THE INVENTION

The present invention is directed to a method of characterizing global routing congestion in an integrated circuit design, by receiving a global routing of the circuit design having multiple tiles with global edges and wiring track assignments for the global edges, computing global edge congestions for the global edges based on wiring track usage, constructing at least one histogram of averages of the global edge congestions for varying percentages of worst edge congestion. The invention can operate separately on horizontal global edges and vertical global edges to derive histograms of averages of horizontal global edge congestions and averages of the vertical global edge congestions. In the illustrative embodiment the averages of the global edge congestions are mean averages. The invention can optionally allow designers to select the specific values for the varying percentages. Exemplary values include 0.5%, 1%, 2%, 5%, 10% and 20%. Global edges near blockages can be skipped to avoid false congestion hotspots. The histogram of the current global routing can be compared to a histogram for a previous global routing to select a best routing solution.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

With advanced technologies, routing becomes more challenging due to a variety of factors including more packed logics, small-track libraries, hierarchical design styles and more metal layers. Additionally, procedures within the physical synthesis process can significantly change congestion, such as placement, buffering and layer assignment. Traditional metrics for characterizing global routing congestion such as net overflows and average 20% worst nets provide some guidance for the designer, but they have proven to be woefully inadequate for these state-of-the-art design techniques. Existing metrics to quantify routing congestion often fail to distinguish a non-congested design from one having severe congestion hotspots. These metrics can indicate that one design should be preferred over another when in actuality they are practically equivalent, and conversely can indicate that two designs have similar congestion when in actuality one has significantly fewer hotspots.

Congestion maps are very useful for subjective visual inspection, but they contain too much data to be amenable to quantitative analysis. There is no quantitative metric that accurately reflects the snapshot routability of a globally routed design. A metric is needed which can truly describe routing congestion of the designs, so multiple physical synthesis solutions can be compared to determine which one is actually better. The present invention provides such a routing congestion metric which is based on a novel histogram of average congestion of the global edges for varying percentages of the worst edges. By calculating the average congestion of the top x % worst edges, the invention can truly capture the contour of all the hot spots. The invention can more effectively guide the optimization of congestion-driven physical synthesis tools, such as congestion-driven placement.

Figure 1A:
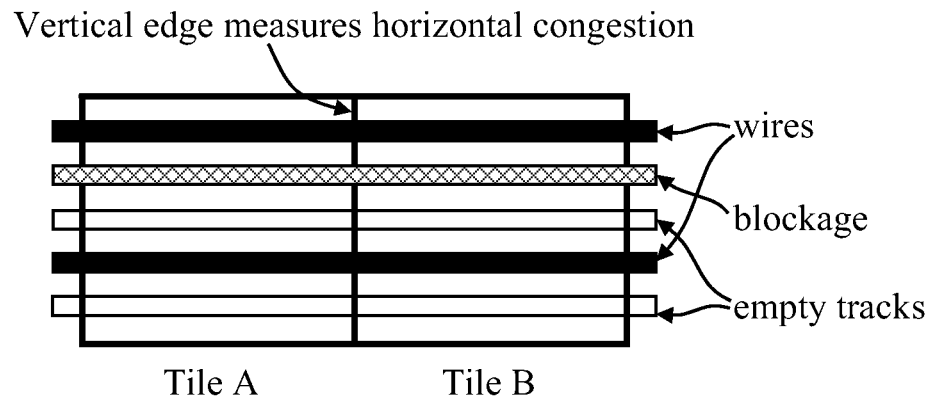
FIG. 1A is a plan view of two tiles of a globally routed integrated circuit design having wiring tracks, illustrating conventional edge congestion measurement for a vertical edge.
Figure 1B:
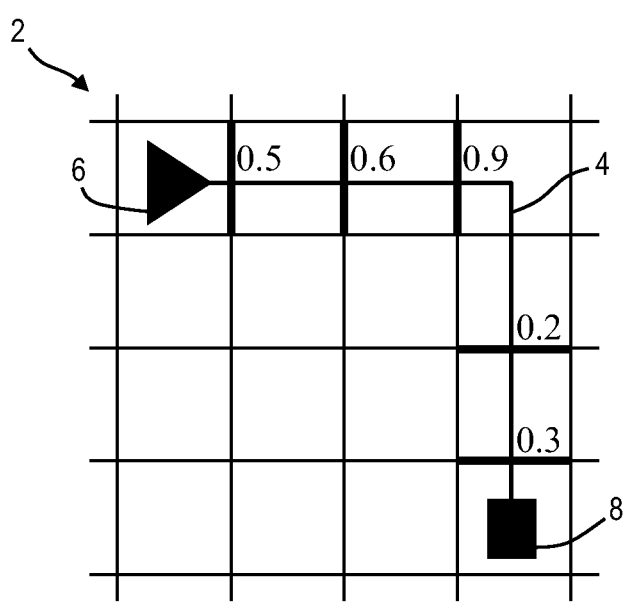
FIG. 1B is a plan view of a globally routed integrated circuit design having a net, illustrating conventional net congestion measurement.
Figure 2:
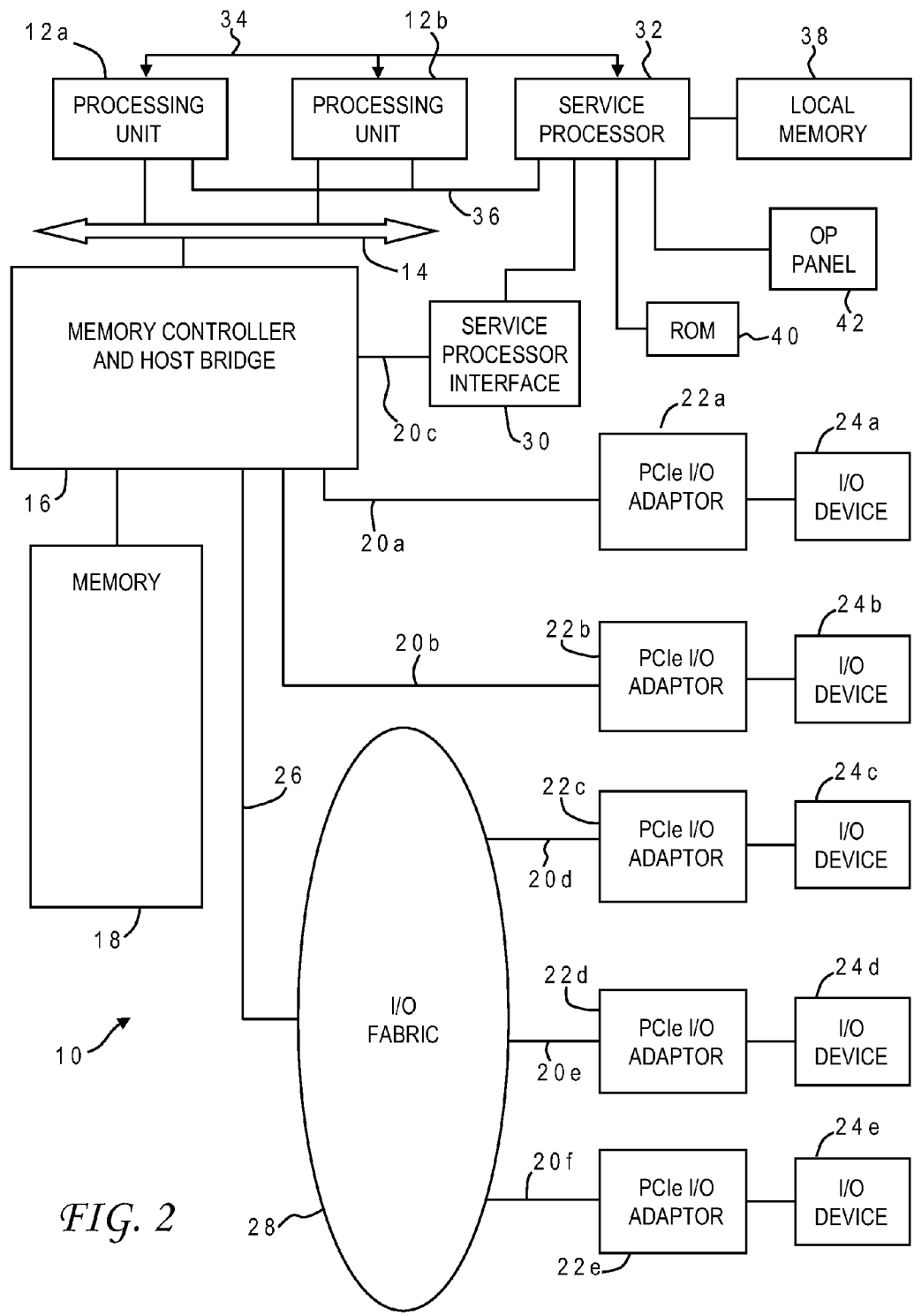
FIG. 2 is a block diagram of a computer system programmed to carry out evaluation of global wiring congestion for an integrated circuit design in accordance with one implementation of the present invention.

With reference now to the figures, and in particular with reference to FIG. 2, there is depicted one embodiment 10 of a computer system in which the present invention may be implemented to carry out the design of logic structures in an integrated circuit, including evaluation of global wiring congestion. Computer system 10 is a symmetric multiprocessor (SMP) system having a plurality of processors 12a, 12b connected to a system bus 14. System bus 14 is further connected to a combined memory controller/host bridge (MC/HB) 16 which provides an interface to system memory 18. System memory 18 may be a local memory device or alternatively may include a plurality of distributed memory devices, preferably dynamic random-access memory (DRAM). There may be additional structures in the memory hierarchy which are not depicted, such as on-board (L1) and second-level (L2) or third-level (L3) caches.

MC/HB 16 also has an interface to peripheral component interconnect (PCI) Express links 20a, 20b, 20c. Each PCI Express (PCIe) link 20a, 20b is connected to a respective PCIe adaptor 22a, 22b, and each PCIe adaptor 22a, 22b is connected to a respective input/output (I/O) device 24a, 24b. MC/HB 16 may additionally have an interface to an I/O bus 26 which is connected to a switch (I/O fabric) 28. Switch 28 provides a fan-out for the I/O bus to a plurality of PCI links 20d, 20e, 20f. These PCI links are connected to more PCIe adaptors 22c, 22d, 22e which in turn support more I/O devices 24c, 24d, 24e. The I/O devices may include, without limitation, a keyboard, a graphical pointing device (mouse), a microphone, a display device, speakers, a permanent storage device (hard disk drive) or an array of such storage devices, an optical disk drive, and a network card. Each PCIe adaptor provides an interface between the PCI link and the respective I/O device. MC/HB 16 provides a low latency path through which processors 12a, 12b may access PCI devices mapped anywhere within bus memory or I/O address spaces. MC/HB 16 further provides a high bandwidth path to allow the PCI devices to access memory 18. Switch 28 may provide peer-to-peer communications between different endpoints and this data traffic does not need to be forwarded to MC/HB 16 if it does not involve cache-coherent memory transfers. Switch 28 is shown as a separate logical component but it could be integrated into MC/HB 16.

In this embodiment, PCI link 20c connects MC/HB 16 to a service processor interface 30 to allow communications between I/O device 24a and a service processor 32. Service processor 32 is connected to processors 12a, 12b via a JTAG interface 34, and uses an attention line 36 which interrupts the operation of processors 12a, 12b. Service processor 32 may have its own local memory 38, and is connected to read-only memory (ROM) 40 which stores various program instructions for system startup. Service processor 32 may also have access to a hardware operator panel 42 to provide system status and diagnostic information.

In alternative embodiments computer system 10 may include modifications of these hardware components or their interconnections, or additional components, so the depicted example should not be construed as implying any architectural limitations with respect to the present invention. The invention may further be implemented in an equivalent cloud computing network.

When computer system 10 is initially powered up, service processor 32 uses JTAG interface 34 to interrogate the system (host) processors 12a, 12b and MC/HB 16. After completing the interrogation, service processor 32 acquires an inventory and topology for computer system 10. Service processor 32 then executes various tests such as built-in-self-tests (BISTs), basic assurance tests (BATs), and memory tests on the components of computer system 10. Any error information for failures detected during the testing is reported by service processor 32 to operator panel 42. If a valid configuration of system resources is still possible after taking out any components found to be faulty during the testing then computer system 10 is allowed to proceed. Executable code is loaded into memory 18 and service processor 32 releases host processors 12a, 12b for execution of the program code, e.g., an operating system (OS) which is used to launch applications and in particular the congestion evaluation application of the present invention, results of which may be stored in a hard disk drive of the system (an I/O device 24). While host processors 12a, 12b are executing program code, service processor 32 may enter a mode of monitoring and reporting any operating parameters or errors, such as the cooling fan speed and operation, thermal sensors, power supply regulators, and recoverable and non-recoverable errors reported by any of processors 12a, 12b, memory 18, and MC/HB 16. Service processor 32 may take further action based on the type of errors or defined thresholds.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable media may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. The computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this invention, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, written for a variety of platforms such as an AIX environment or operating systems such as Windows 7 or Linux. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks. Such storage media excludes transitory media.

The computer program instructions may further be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Computer system 10 carries out program instructions for an integrated circuit design process that uses a novel histogram approach to characterize global wire congestion. Accordingly, a program embodying the invention may include conventional aspects of various design, routing and analysis tools, and these details will become apparent to those skilled in the art upon reference to this disclosure.

Figures 3A, 3B:
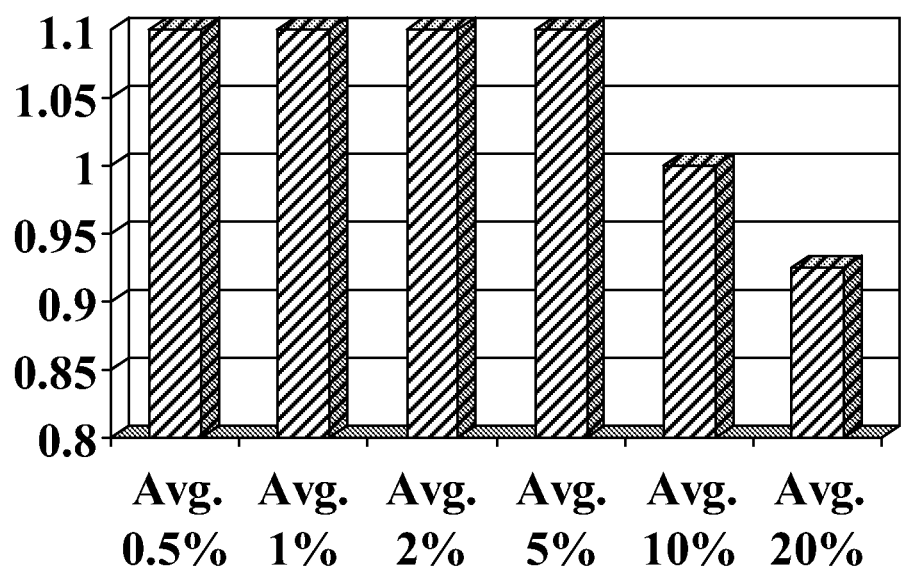
FIG. 3A is a plan view of a globally routed integrated circuit design whose vertical congestion is to be characterized according to the present invention.
FIG. 3B is a graph of a histogram of average global edge congestion for the exemplary integrated circuit design of FIG. 3A with varying percentages of worst edge congestion.

Referring now to FIG. 3A, there is depicted a vertical edge example for an integrated circuit design 50 which has been globally routed to define a grid having tiles with global edges. In this example the height and width of the tiles are the same, but the invention can be used for other aspect ratios, and even for non-rectangular shapes (e.g., triangular, parallelogram or hexagonal). Edge congestion values for the twenty vertical edges in this routing vary from 0.1 to 1.1. Those skilled in the art will appreciate that this routing case is simplified since an advanced integrated circuit design may have hundreds of tiles and associated edge congestion values. FIG. 3B illustrates a histogram constructed in accordance with the present invention of average edge congestion for the routed design 50. In this implementation, the histogram has six different worst (most congested) percentages: 0.5%, 1%, 2%, 5%, 10% and 20%. These percentages are exemplary, and in a preferred embodiment of the present invention the number and values of the worst percentages may be selected by the designer, i.e., the histogram may have more or fewer than six worst percentages, and the worst percentages could be less than 0.5% or greater than 20%. Another histogram may be similarly constructed for the horizontal edge congestion.

In the example of FIG. 3B, the histogram averages for worst percentages of 0.5%, 1%, 2% and 5% are all the same (1.1 congestion) because there is only one edge for those percentages. The histogram begins to fall off at a worst percentage of 10% to an average congestion of $(1.1+0.9)/2=1.0$, and falls further at 20% to an average congestion of $(1.1+0.9+0.9+0.8)/4=0.925$. By using edge congestion directly rather than net congestion, the present invention is able to accurately capture the overall congestion and still characterize the congestion with much less data than a conventional congestion map.

Histograms constructed in accordance with the present invention may give indications of hotspots but, more importantly, they provide a quantitative basis for selecting different routing designs during physical synthesis. Table 1 shows an example of two routing designs, A and B, which were experimentally devised for the same integrated circuit design, giving the congestion measurements according to the old worst 20% nets metric and according to the new average global edge histogram.

TABLE 1

|  |  | Design A | Design B |
| --- | --- | --- | --- |
| Old Metric |  | 84.41 | 78.09 |
| New Metric | 0.5% | 90.47 | 90.27 |
|  | 1% | 89.23 | 89.13 |
|  | 2% | 87.65 | 87.86 |
|  | 5% | 85.93 | 86.14 |
|  | 10% | 84.16 | 84.59 |
|  | 20% | 82.48 | 82.57 |

Figure 4:
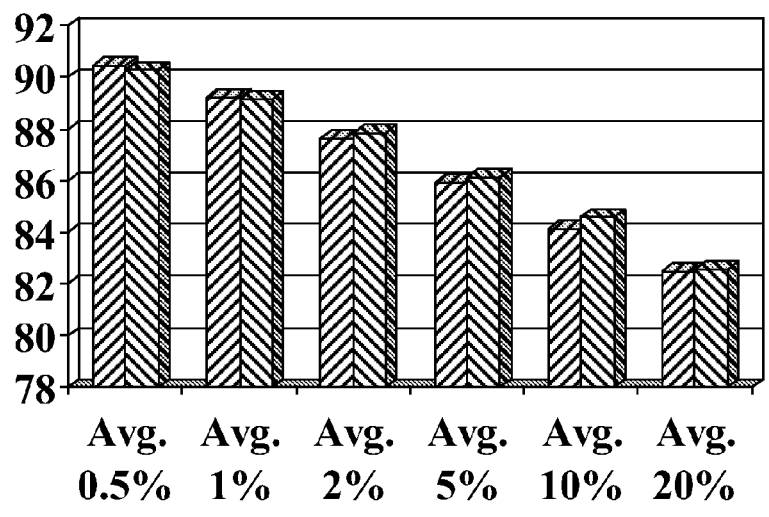
FIG. 4 is a graph of dual histograms of average global edge congestion for two different versions of an exemplary integrated circuit design, which are compared to select a best routing solution in accordance with one implementation of the present invention.

Table 1 shows that, using the old metric, the designer (or design tool) would choose Design B as the best solution since its worst 20% nets value is less. However, as can be seen graphically in FIG. 4, the new metric correctly reveals that these two designs are very similar. Conversely, the invention may be used to reveal the better of two solutions when the conventional measurements would indicate that the two designs have essentially the same congestion. For example, a Design C having 10% worst nets with 100% congestion and the next 10% worst nets with 60% will have a worst 20% net congestion value of 80%, and a Design D having evenly spread 20% worst nets with 80% congestion will also have a worst 20% net congestion value of 80%, so the designer (or design tool) would assume these designs are equivalent for congestion purposes. However, the new metric will correctly reveal that Design C has worse routability since it will have a much higher value for the top 0.5% average global edge congestion.

Figure 5:
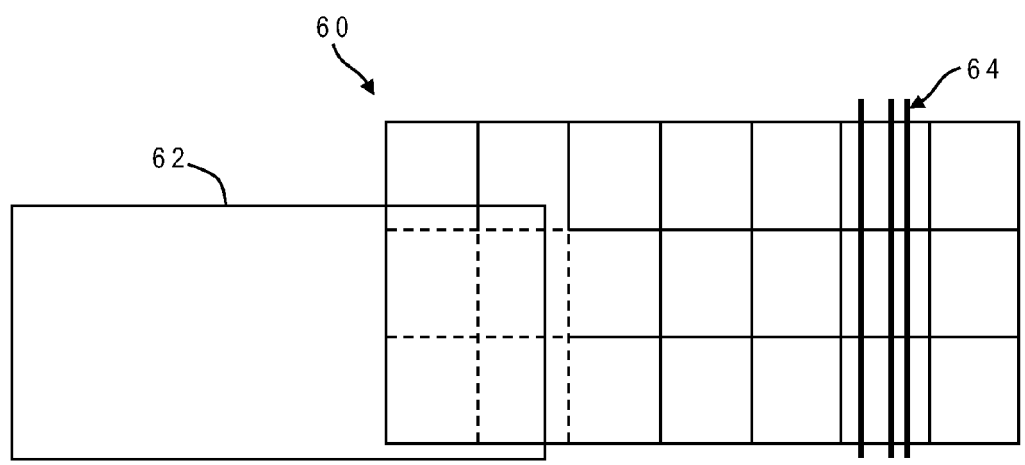
FIG. 5 is a plan view of a globally routed integrated circuit design illustrating the handling of blockages in computation of average global edge congestion in accordance with one implementation of the present invention.

Another problem with prior art congestion metrics is the false alarms that can arise from blockages in the circuit design, e.g., logic macros, proprietary blocks (IP), or static random-access memory (SRAM). These blockages create apparent congestion hotspots which can be easily handled with a small change in global routing. The present invention allows for embodiments which overcome this deficiency by skipping selected edges near the blockages when computing the global edge congestion averages. FIG. 5 shows an example with a global routing 60 having a blockage 62. In the preferred implementation, the average ignores any global edge having an adjacent tile which is more than 50% blocked, but this percentage may vary higher or lower than 50%. The global edges shown in FIG. 5 as dashed lines will accordingly be excluded from the averaging computations. This approach allows the congestion analysis tool to distinguish boundaries near global blockages as opposed to minor blockages such as wiring reservations 64 for a power grid. In an alternative implementation, a global edge next to a partially blocked tile is skipped only if that partially blocked tile is next to a threshold number n of fully-blocked tiles (the threshold may be as low as 1).

The invention is particularly useful in congestion mitigation. There are known techniques for mitigating congestion which use the congestion map to identify a particular set of cells (hotspot) and spread them out. Such congestion placement tools can be driven using the new metric. Congestion placement iterates until the average global edge histogram saturates. Different rules may be used to decide when saturation occurs, such as selected histogram elements being within a threshold percentage. For example, if the average congestion of the worst 0.5% edges has stabilized but the worst 1% value is still decreasing, then the tool proceeds with another iteration. This approach represents an improvement over the old worst nets metrics. For example, congestion-driven placement may decrease the number of nets >100% congested, but may concurrently increase the number of nets >90% congested. In such a case, congested-driven placement could stop (i.e., the old metric saturates), but further improvement is still available.

Figure 6:
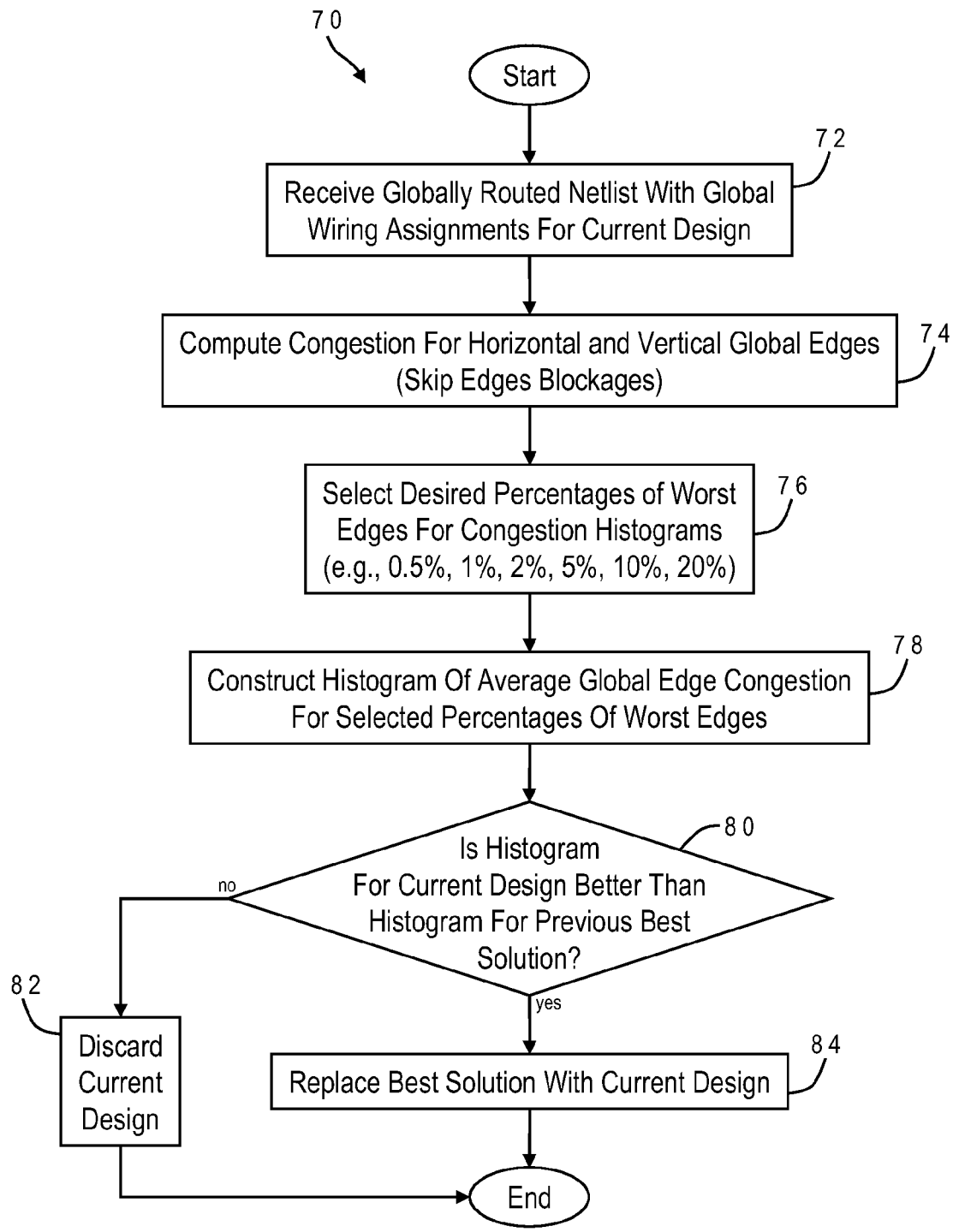
FIG. 6 is a chart illustrating the logical flow for an evaluation process which compares average global edge congestion histograms for different designs to select a best routing solution in accordance with one implementation of the present invention.

The invention may be further understood with reference to the chart of FIG. 6 which illustrates the logical flow for a congestion evaluation process 70 in accordance with one embodiment of the present invention. The process begins when computer system 10 receives a globally routed design 72, e.g., a netlist having global wiring assignments for the current design. The congestion for horizontal and vertical edges is computed skipping edges near blockages 74. The desired percentages for the worst edge histogram are then selected 76 (e.g., 0.5%, 1%, 2%, 5%, 10%, 20%), and the histogram is constructed 78. A determination is made as to whether the histogram for the current design is better than a histogram for the previous best solution 80 (i.e., whether the histogram has saturated). If the current design is not better, it is discarded 82. If the current design is better, it becomes the new best solution 84, and the process ends.

The present invention thereby enhances congestion analysis by offering a powerful new tool for the designer. The invention may be easily implemented independent of design size or the number of global edges. The invention also allows the separate consideration of horizontal and vertical congestion, which was impossible with the prior art net congestion metrics. Using the new metric to compare different physical synthesis solutions further helps guide the routing congestion mitigation transforms.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, the invention preferably utilizes the mean of the worst x % edges in computing the average, but the average could also be computed as a median or mode. It is therefore contemplated that such modifications can be made without departing from the spirit or scope of the present invention as defined in the appended claims.

What is claimed is:

1. A method of characterizing global routing congestion in an integrated circuit design, comprising:
receiving a global routing of the circuit design, the global routing having multiple tiles with global edges and wiring track assignments for the global edges, by executing first instructions in a computer system;
computing global edge congestions for the global edges based on wiring track usage, by executing second instructions in the computer system; and
constructing at least one histogram of averages of the global edge congestions for varying percentages of worst edge congestion, by executing third instructions in the computer system.

2. The method of claim 1 wherein:
the global edges include horizontal global edges and vertical global edges;
said computing includes computing horizontal global edge congestions for the horizontal global edges and computing vertical global edge congestions for the vertical global edges; and
said constructing includes constructing a first histogram of averages of the horizontal global edge congestions for the varying percentages of worst edge congestion, and constructing a second histogram of averages of the vertical global edge congestions for the varying percentages of worst edge congestion.

3. The method of claim 1 wherein the averages of the global edge congestions are mean averages.

4. The method of claim 1, further comprising selecting different values for the varying percentages.

5. The method of claim 1 wherein the varying percentages include 0.5%, 1%, 2%, 5%, 10% and 20%.

6. The method of claim 1 wherein said computing excludes global edges which are adjacent a tile having a blockage greater than 50%.

7. The method of claim 1 wherein said computing excludes global edges which are adjacent a first tile having a partial blockage when the first tile is adjacent a second tile which is fully blocked.

8. The method of claim 1, further comprising comparing the histogram of the global routing to a histogram for a previous global routing to select a best routing solution.

9. A computer system comprising:
one or more processors which process program instructions;
a memory device connected to said one or more processors; and
program instructions residing in said memory device for characterizing global routing congestion in an integrated circuit design by receiving a global routing of the circuit design having multiple tiles with global edges and wiring track assignments for the global edges, computing global edge congestions for the global edges based on wiring track usage, and constructing at least one histogram of averages of the global edge congestions for varying percentages of worst edge congestion.

10. The computer system of claim 9 wherein:
the global edges include horizontal global edges and vertical global edges; and
said program instructions compute horizontal global edge congestions for the horizontal global edges, compute vertical global edge congestions for the vertical global edges, construct a first histogram of averages of the horizontal global edge congestions for the varying percentages of worst edge congestion, and construct a second histogram of averages of the vertical global edge congestions for the varying percentages of worst edge congestion.

11. The computer system of claim 9 wherein the averages of the global edge congestions are mean averages.

12. The computer system of claim 9 wherein said program instructions further allow selection of different values for the varying percentages.

13. The computer system of claim 9 wherein the varying percentages include 0.5%, 1%, 2%, 5%, 10% and 20%.

14. The computer system of claim 9 wherein the computing of the global edge congestions excludes global edges which are adjacent a tile having a blockage greater than 50%.

15. The computer system of claim 9 wherein the computing of the global edge congestions excludes global edges which are adjacent a first tile having a partial blockage when the first tile is adjacent a second tile which is fully blocked.

16. The computer system of claim 9 wherein said program instructions further compare the histogram of the global routing to a histogram for a previous global routing to select a best routing solution.

17. A computer program product comprising:
a computer-readable storage medium; and
program instructions residing in said storage medium for characterizing global routing congestion in an integrated circuit design by receiving a global routing of the circuit design having multiple tiles with global edges and wiring track assignments for the global edges, computing global edge congestions for the global edges based on wiring track usage, and constructing at least one histogram of averages of the global edge congestions for varying percentages of worst edge congestion.

18. The computer program product of claim 17, further comprising:
the global edges include horizontal global edges and vertical global edges; and
said program instructions compute horizontal global edge congestions for the horizontal global edges, compute vertical global edge congestions for the vertical global edges, construct a first histogram of averages of the horizontal global edge congestions for the varying percentages of worst edge congestion, and construct a second histogram of averages of the vertical global edge congestions for the varying percentages of worst edge congestion.

19. The computer program product of claim 17 wherein the averages of the global edge congestions are mean averages.

20. The computer program product of claim 17 wherein said program instructions further allow selection of different values for the varying percentages.

21. The computer program product of claim 17 wherein the varying percentages include 0.5%, 1%, 2%, 5%, 10% and 20%.

22. The computer program product of claim 17 wherein the computing of the global edge congestions excludes global edges which are adjacent a tile having a blockage greater than 50%.

23. The computer program product of claim 17 wherein the computing of the global edge congestions excludes global edges which are adjacent a first tile having a partial blockage when the first tile is adjacent a second tile which is fully blocked.

24. The computer program product of claim 17 wherein said program instructions further compare the histogram of the global routing to a histogram for a previous global routing to select a best routing solution.

* * * * *